(12) United States Patent
Luan

(10) Patent No.: US 9,177,939 B2
(45) Date of Patent: Nov. 3, 2015

(54) LEADLESS SURFACE MOUNT ASSEMBLY PACKAGE AND METHOD OF MANUFACTURING THE SAME

(71) Applicant: STMicroelectronics (Shenzhen) R&D Co., Ltd., Shenzhen (CN)

(72) Inventor: Jing-En Luan, Shenzhen (CN)

(73) Assignee: STMicroelectronics (Shenzhen) R&D Co., Ltd., Nanshan, Shenzhen (CN)

( * ) Notice: Subject to any disclaimer, the term of this patent is extended or adjusted under 35 U.S.C. 154(b) by 0 days.

(21) Appl. No.: 14/553,799

(22) Filed: Nov. 25, 2014

(65) Prior Publication Data

US 2015/0145110 A1 May 28, 2015

(30) Foreign Application Priority Data

Nov. 27, 2013 (CN) .......................... 2013 1 0629974

(51) Int. Cl.
*H01L 23/00* (2006.01)
*H01L 23/495* (2006.01)
*H01L 21/56* (2006.01)
*H01L 23/31* (2006.01)

(52) U.S. Cl.
CPC .............. *H01L 24/83* (2013.01); *H01L 21/561* (2013.01); *H01L 23/49524* (2013.01); *H01L 23/49551* (2013.01); *H01L 23/49562* (2013.01); *H01L 23/3107* (2013.01)

(58) Field of Classification Search
CPC .......................... H01L 23/49575; H01L 24/39
See application file for complete search history.

(56) References Cited

U.S. PATENT DOCUMENTS 6,489,218 B1 * 12/2002 Kim et al. ..................... 438/460
8,952,509 B1 * 2/2015 Yilmaz et al. ................. 257/676

* cited by examiner

*Primary Examiner* — Roy Potter
(74) *Attorney, Agent, or Firm* — Seed IP Law Group PLLC

(57) ABSTRACT

Embodiments of the present disclosure relate to a leadless surface mount assembly package, an electronic device, and a method for forming a surface mount assembly package, which package comprising: a first lead; a second lead; a chip fixed on an upper surface of the first lead; a clip coupled to the second lead, a lower surface of the clip being fixed to an upper surface of the chip. The surface mount assembly package further comprises a molding compound for molding the first lead, the second lead, the chip, and the clip, wherein ends of the first lead and the second lead are only exposed from the molding compound, without outward extending from the molding compound. By using the embodiments of the present disclosure, costs can be saved and processing flow can be simplified, and a new-model leadless surface mount assembly package is obtained.

14 Claims, 3 Drawing Sheets

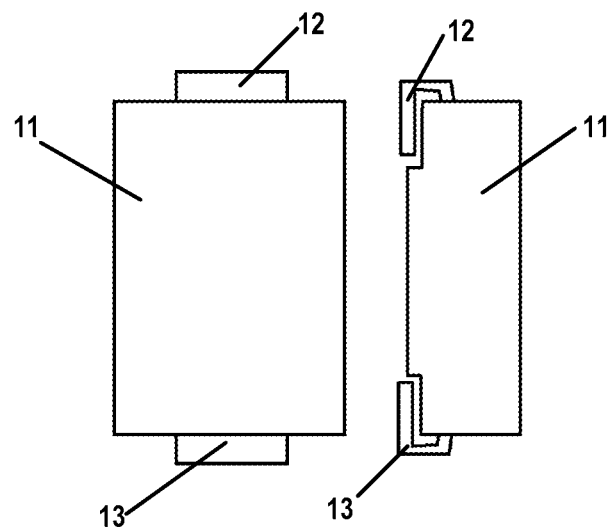
Figure 1A
Prior Art
Figure 1B
Prior Art
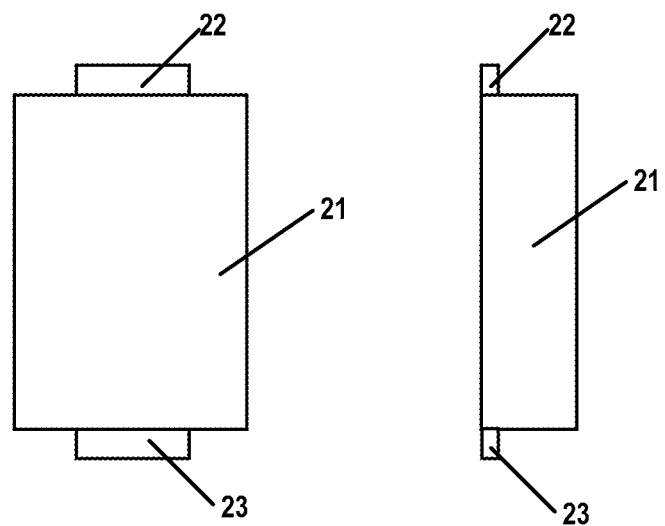
Figure 2A
Prior Art
Figure 2B
Prior Art

LEADLESS SURFACE MOUNT ASSEMBLY PACKAGE AND METHOD OF MANUFACTURING THE SAME

BACKGROUND

1. Technical Field

Embodiments of the present disclosure generally relate to the field of electronic devices, and more specifically, to a surface mount assembly and a method of manufacturing the same.

2. Description of the Related Art

The surface mount technology (SMT) is the most prevalent technology and process in the current electronic packaging industry. Without bothering to drill plug-in holes on a circuit board, a surface mount element is directly attached or soldered by SMT to a prescribed position on the surface of the circuit board. The SMT has advantages such as high density, compact size for an electronic product, and light weight. The volume and weight of a surface mount device is only 1/10 of a traditional plug-in mounting element. Generally, with the SMT, the volume of an electronic product is reduced by 40%~60%, while the weight may reduce by 60%~80%. Besides, SMT further has advantages such as high reliability, strong anti-shock capability, low soldering point defect rate, and good high-frequency features; besides, it can also reduce electromagnetic and radio frequency interferences, be easily automated, promote productivity, reduce costs as high as 30%~50%, saves materials, energy, facilities, manpower, and time, etc.

Despite the above, the surface mount technology still has room to improve, e.g., further reducing costs, simplifying production process, and the like.

BRIEF SUMMARY

Embodiments of the present disclosure provide a new surface mount device package and a method for manufacturing the same.

According to an aspect of the present disclosure, there is provided a leadless surface mount assembly package. The leadless surface mount assembly package comprises: a first lead; a second lead; a chip fixed on an upper surface of the first lead; a clip coupled to the second lead, a lower surface of the clip being fixed to an upper surface of the chip. The surface mount assembly package further comprises a molding compound for molding the first lead, the second lead, the chip, and the clip, wherein ends of the first lead and the second lead are only exposed from the molding compound, without outward extending from the molding compound.

According to another aspect of the present disclosure, there is provided an electronic device comprising a package recited above.

According to a further aspect of the present disclosure, there is provided a method for forming a surface mount assembly package. The method comprises: providing a plurality of first leads and a plurality of second leads; providing a plurality of chips; fixing the chips to corresponding first leads, respectively; providing a plurality of clips; coupling the clips to corresponding second leads, respectively, and fixing lower surfaces of the clips on upper surfaces of corresponding chips. The method further comprises: molding the plurality of first leads, the plurality of second leads, the chip, and the clip using a molding compound to form a package array; and cutting the package array to form a plurality of individual packages, wherein ends of first leads and second leads of each formed package are only exposed from the molding compound without outward extending from the molding compound.

According to still further aspect of the present disclosure, there is provided a method for forming a surface mount assembly package. The method comprises: providing a first lead and a second lead; providing a chip; fixing the chip on the first lead; providing a clip; coupling the clip and the second lead, and fixing a lower surface of the clip on an upper surface of the chip. The method further comprises: molding the first lead, the second lead, the chip and the clip using a molding compound, thereby forming the package, wherein ends of the first lead and the second lead are only exposed from the molding compound without outward extending from the molding compound.

According to some embodiments of the present disclosure, corresponding advantageous effects can be achieved.

BRIEF DESCRIPTION OF THE SEVERAL VIEWS OF THE DRAWINGS

Some embodiments are illustrated exemplarily in the accompanying drawings that are not drawn proportionally. In the accompanying drawings, like reference numerals represent like components, wherein:

FIG. 1A is a top view of a prior surface mount assembly;

FIG. 1B is a side view of the surface mount assembly in FIG. 1A;

FIG. 2A is a top view of another prior surface mount assembly;

FIG. 2B is a side view of the surface mount assembly in FIG. 2A;

DETAILED DESCRIPTION

Figure 3:
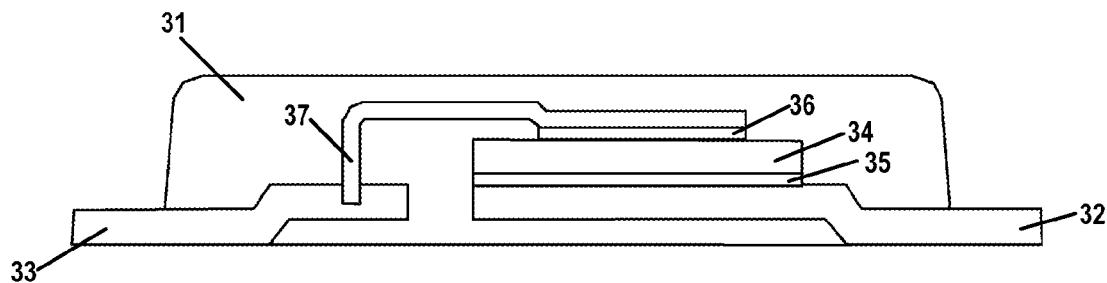
FIG. 3 is a cross-section view of the surface mount assembly shown in FIGS. 2A and 2B.

Some specific details will be illustrated in the following description to provide a thorough understanding on various aspects of the subject matter as disclosed. However, the disclosed subject matter can also be implemented without these specific details. In some instances, known structures and methods that form a structure associated with the surface mount technology are not described in detail so as to avoid ambiguity to the description of other aspects of the present disclosure.

Unless otherwise indicated in the context, the term "comprise," "include" or other similar expression should be interpreted into an open inclusion meaning throughout the whole text of the description and the appended claims, i.e., interpreted as "include, but not limited to."

In the whole text of the present description, recitation of "one embodiment" or "an embodiment" means specific features, structures or characteristics described in conjunction with the embodiment are included in at least one embodiment. Therefore, phrases "in one embodiment" or "in an embodiment" appearing in various parts throughout the description do not necessarily refer to the same aspect. Further, particular features, structures, or characteristics may be combined in any appropriate manner in one or more aspects of the present disclosure. The term "leadless" herein refer to no lead extending outward from a device Now, refer to FIG. 1A, in which a top view of a prior surface mount assembly is presented. In the surface mount assembly package of FIG. 1A, there comprises a molding compound 11 and internal components (not shown) molded by the molding compound. An end 12 of a first lead (not completely shown) among the internal components extends outward from the molding compound 11; an end 13 of a second lead (not completely shown) among the internal compounds extends outward from the molding compound 11.

FIG. 1B shows a side view of the surface mount assembly package of FIG. 1A. As shown in FIG. 1B, leads 12 and 13 extend outward from two sides of the molding compound and are bent to a bottom surface of the molding compound. It is seen from FIG. 1B that space is reserved at two sides of the bottom of the package, such that bottom surfaces of the leads 12 and 13 that are bent downward and the bottom surface of the molding compound are substantially in the same plane, which facilitates mounting the package surface onto a device such as a circuit board.

Refer to FIG. 2A, in which a top view of another prior surface mount assembly is presented. In the surface mount assembly package of FIG. 2A, there comprises a molding compound 21 and internal components (not shown) molded by the molding compound 21. An end 22 of a first lead (not completely shown) among the internal components extends outward from the molding compound 21; an end 23 of a second lead (not completely shown) among the internal compounds extends outward from the molding compound 21.

FIG. 2B shows a side view of the surface mount assembly package of FIG. 2A. As shown in FIG. 2B, leads 22 and 23 extend outward from two sides of the molding compound, but do not bend adjacent to a bottom surface of the molding compound like in FIG. 1B, but extends in a plane where the bottom surface of the molding compound 21 is located. This kind of surface mount assembly package is called Surface Mount Assembly Flat (SMAF).

Now, refer to FIG. 3 in which a cross-section view of the SMAF shown in FIG. 2A and FIG. 2B is presented. Now, the internal structure of the SMAF will be described in detail so as to facilitate understanding the principle of the present disclosure as described infra. As shown in FIG. 3, a molding compound 31 molds internal components and exposes a large end region of leads 32 and 33. The molding compound is well-known to those skilled in the art, e.g., epoxy resin may be selected as a molding compound.

In the package shown in FIG. 3, the first lead 32 and the second lead 33 extend outward from two sides of the package. The first lead 32 and the second lead 33 are made of a metal material, such as copper or alloy, to conduct electrical signals. For example, the first lead 32 may be connected to a grounded level, while the second lead 33 may be connected to a gasket of a power source level or other non-grounded level. It would be appreciated that the lead 32 should have a good electrical conductive performance, a certain extent of heat-endurable performance, and a certain extent of rigidity, such that the lead 32 will not be fused or significantly deformed in the subsequent fixing the chip to the upper surface of the first lead 32 via solder 35 using a reflow soldering technology known to those skilled in the art. The second lead 33, for example, may also be made of copper. It would be appreciated that those skilled in the art may select manufacturing the second lead 33 with a material different from the first lead 32 according to the needs (e.g., type of the transmission level or signal, circuit board to be mounted, etc.) when practicing the technical solution of the present disclosure. It may be understood that the positions and shapes of the first lead 32 and the second lead 33 as shown in FIGS. 2A, 2B and 3 are only exemplary and the first lead 32 and the second lead may extend in the same side of the molding compound with mutual insulation.

Those skilled in the art would appreciate that leads are not restricted only to line shapes, but may comprise: stripe, band, plate or any shape that may transmit electrical signal/level between an external circuit and the chip.

The chip 34 may be fixed on an upper surface of the lead 32 using a solder 35 known to those skilled in the art. The type of solder in use is also well known to those skilled in the art, e.g., SnPb. It would be appreciated that when practicing the technical solution of the present disclosure, those skilled in the art may select other solder according to the needs (e.g., material and/or shape of the lead, material and/or shape of the clip that will be described infra, and chip type, etc.).

Next, a clip 37 in the embodiment of FIG. 3 will be described. The clip 37 is mainly used for fixing the second lead 33 and the chip 34, and power level or signal is transmitted between the second lead 33 and the chip 34. The clip 37 may be made of copper or alloy. The material of the clip 37 may be identical to or different from the first lead 32 and/or second lead. Here, it should be noted that in FIG. 3, since the clip 37 presents a bent "L" shape, with one leg at 90° to the second leg. The clip 37 must have a certain extent of flexibility, such that breakage or cracks do not easily occur to affect transmission of power level or signal after being bent at about 90°. A lower surface of one end of the clip 37 is fixed to the upper surface of the chip via the solder 36. The solder 36 may be identical to or different from the solder 35. Another end of the clip 37 is fixed to the second lead 33 by mechanical engagement. The clip 37 is mechanically and electrically coupled to the second lead 33 and has a sharp bend of about 90° therein.

In the embodiment of FIG. 3, the chip 34 is a diode chip; the positive electrode and negative electrode of the diode 34 are electrically coupled to an external circuit via the first lead 32 and the second lead 33. Those skilled in the art would appreciate that the chip 34 may be other type of chip suitable for being packaged in the SMA, e.g., an active device.

Hereinafter, a method of manufacturing the above SMAF package will be described briefly.

Generally, a plurality of first leads 32 and a plurality of second leads 33 are located in a lead frame comprising a plurality of unit module arrays. Each unit module is generally rectangular and comprises a first lead 32 and a second lead 33, wherein the first lead 32 and the second lead 33 are coupled to opposite two edges of the rectangle. More generally, a lead frame comprising a plurality of first leads 32 and a plurality of second leads 33 is integrally formed using, for example, a copper material. Then, the chip is fixed to a corresponding first lead 32 using the solder as mentioned above, and the chip is electrically coupled to the second lead 33 using the solder and clip as mentioned above. Afterwards, in each unit module, the first lead 32, the second lead 33, the clip 37, and the chip 34 are molded using the molding compound to form a package. After the package is formed in each unit module, each unit module is separated successively from the lead frame by cutting just the lead frame where the packages meet, thereby obtaining a plurality of SMAF packages.

In the above method, e.g., the lead frame is not fully utilized, which causes waste of material (the lead frame will be discarded after separation of the packages), thereby increasing costs. It is found through study on the above SMAF that the method of manufacturing the SMAF can be further improved to achieve a new-model SMAF. Also, the molding process and mold itself are complex and expensive.

The mold cavity to form the packages leaves the outer edges 32 and 33 exposed, to not be covered in molding compound. This requires a detailed and custom mold cavity for each and different sized package.

Figure 4:
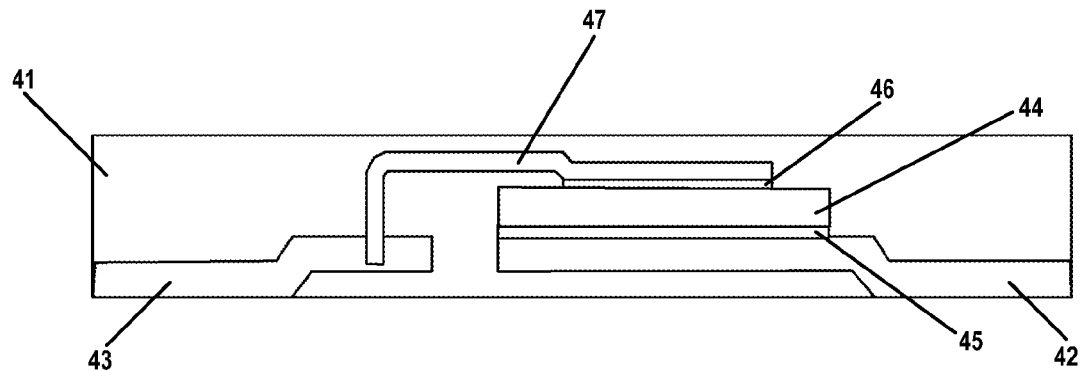
FIG. 4 is a cross-section view of a surface mount assembly according to an embodiment of the present disclosure.

An SMAF package according to one embodiment of the present disclosure will be described with reference to FIG. 4. The package in FIG. 4 comprises a lead 42, a lead 43, a solder 45, a solder 46, a chip 44, and a clip 47 molded in the molding compound 41. The chip 44 is fixed on an upper surface of the lead 42 through solder using the reflow method, and the lower surface of the clip 47 is fixed on the upper surface of the chip 44 through solder by using the reflow method. The clip 47 is secured to the lead 43 by mechanical snap-fit. The embodiment of FIG. 4 is similar to the package shown in FIG. 3, except that the first lead 42 and the second lead 43 are exposed from opposite sides of the molding compound without outward extending therefrom, which is decided by the manufacturing method according to the embodiments of the present disclosure. For the sake of brevity, description of the components in the package in FIG. 4 that are known in the prior art are not described in detail.

As stated above, those skilled in the art may understand, the first lead 42 and the second lead 43 may be located with mutual insulation at the same side of the molding compound, e.g., the second lead 43 extends from the upper surface of the chip 44 towards the first lead 42, such that the first lead 42 and the second lead 43 may be insulated from each other and exposed in parallel from the same side of the molding compound 41. In one optional example, the second lead 44 may be integrally formed with the clip 47.

In one optional example, the lower surfaces of the first lead 42 and the second lead 43 are exposed from the bottom surface of the molding compound 41. In other words, the lower surfaces of the first lead 42 and the second lead 43 are located in substantially the same plane as the bottom surface of the molding compound 41.

Figure 5:
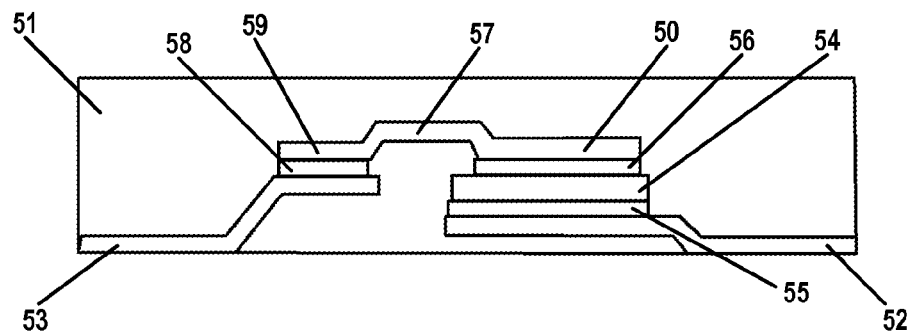
FIG. 5 is a cross-section view of a surface mount assembly according to another embodiment of the present disclosure.

FIG. 5 shows an SMAF package according to another embodiment of the present disclosure, wherein the package comprises a lead 52, a lead 53, an adhesive coupling 55, an adhesive coupling 56, a chip 54, and a clip 57 molded by a molding compound 51. The chip 54 is fixed on an upper surface of the lead 52 through an adhesive such as solder using the reflow method, and the lower surface of the clip 57 is fixed on the upper surface of the chip 54 through an adhesive such as solder by using the reflow method. The adhesive 55 and 56 can therefore be solder or it can be any conductive adhesive, such as a metal infused glue or any other bond that provides strong mechanical and electrical coupling. The embodiment of FIG. 5 is substantially identical to the embodiment shown in FIG. 4, except the type of clip 57 and the coupling manner between the clip 57 and the second lead 53 is different. For the sake of brevity, description of the components in the package in FIG. 5 may refer to the description with respect to FIG. 4, which will not be detailed here.

In the embodiment of FIG. 5, the clip 57 is a cap shape flat in the two ends 50 and 59. It may project slightly upward in the middle but this is not required. In the embodiment of FIG. 5, the height of the second lead 53 is increased; and one end 50 of the clip 57 is fixed to an upper surface of the chip 54 through the solder 56. In the embodiment of FIG. 5, the other end 59 of the clip 57 is fixed on the upper surface of one end of the second lead 53. The advantage of this embodiment over that of FIG. 4 is that the clip 57 need not be over-bent, such that a wider range of materials can be selected, and the consumption of material for the clip 57 can be reduced. Besides, the same processing as reflow soldering as used between the clip 57 and the chip 54 and between the chip 54 and the first lead 42 may be used, which may simplify the processing flow. Those skilled in the art would appreciate that the clip 57 may assume other shapes, e.g., a flat sheet shape. In particular, in a preferred embodiment the two ends 50 and 59 of the clip 57 extend parallel to each other with the surfaces that electrically connect to other conductive surfaces being parallel to each other. In one embodiment, the bottom surfaces of ends 50 and 59 that connect to the chip 54 and the second lead 53, respectively, are not only parallel to each other, but are also in the same plane as each other. In some embodiments they are not in the same plane, just parallel on their surfaces that contact their respective conductors. It is not necessary that the top surfaces of the ends 50 and 59 be parallel to each other.

The shape of the clip 57 is selected for ease of manufacture and reliable electrical connection. The central region can be just slightly raised as shown in FIG. 5, or it can be flat so that clip 57 is a single, flat sheet, or it can be bent downward at one side so that the one end, such as 59, is lower than end 50 and there is a slight bend in the center region to place the two ends in different planes.

It is not required that the ends 50 and 59 be parallel to each other, for example, end 59 can be at an angle to the flat surface of 50. However, in a preferred embodiment, the bottom surfaces of both ends 50 and 59 are flat and are in the same plane. This provides ease of manufacture with automatic pick and place machines, for solder application, and other benefits for reliable, low cost manufacture.

Those skilled in the art would appreciate that the SMAF shown in FIGS. 4 and 5 may further comprise a third lead molded by the molding compound, e.g., for transmitting signals or data. The material and shape of the third lead may be identical to or different from the first lead and/or the second lead. The third lead may be exposed from any side of the molding compound, but not extending outward. When the third lead is exposed from the same side of the molding compound as the first or second lead, their exposed ends may be parallel, but mutually insulated. The end of the third lead within the molding compound and not exposed may be mechanically or electrically coupled to the upper surface, or lower surface or a side surface of the chip. The coupling manner between the third lead and the chip may select the manner of connection, such as lead, clip, wire, bonding wires, solder reflow soldering, but those skilled in the art may also select other appropriate coupling manner. While the third lead is not shown, it is similar to lead 53. Another clip 57 or other coupling to the third lead is provided. If the chip 54 is a power transistor that has a third lead, such third lead would connect to a different region of the chip 54 and the clip 57 for this third lead would be electrically isolated from the second clip and lead 53. For example, a power transistor will usually have a drain on the bottom of the package with source and gate contacts on the top. The source and gate contacts will be respectively connected to their leads formed in a manner similar to lead 53. It might be that the lead for the gate is coupled with a bonding wire or other connection and a clip 57 is not used. Since the gate has a lower current flow than the source or drain, it might not be coupled without a clip 57, though this is permitted.

In one optional example, the lower surface of the third lead is exposed from the bottom surface of the molding compound, like the lower surfaces of the first and second leads, so as to facilitate surface mounting. In a further optional example, the third lead is exposed from a side of the molding compound different from the side where the first lead and the second lead are exposed.

Although scenarios in which the SMAF comprises two leads or three leads has been described above, those skilled in the art would appreciate that the SMAF may comprise 4 or more leads, for transmitting different signals/data/levels.

Figure 6:
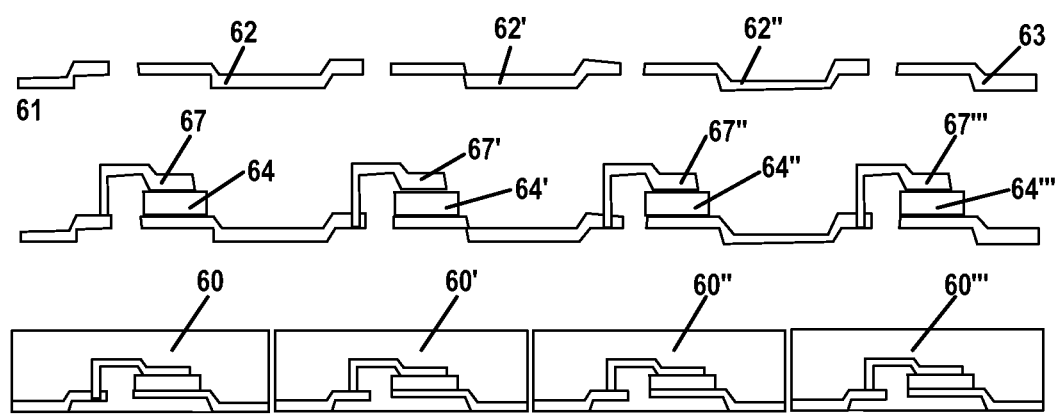
FIG. 6 is a cross-section view of a manufacturing process of a surface mount assembly according to an embodiment of the present disclosure.

Hereinafter, a method of manufacturing a SMAF according to one embodiment of the present disclosure will be described generally with reference to FIG. 6. First, it is provided a plurality of first leads and a plurality of second leads for forming a plurality of packages. With reference to FIG. 6, 4 first leads and 4 second leads are provided to form 4 packages, namely, packages 60, 60', 60", and 60''', wherein the first lead of the first package and the second lead of the second package may be integrated formed into a lead 62; the first mead of the second package and the second lead of the third package may be integrally formed into a lead 62'; the first lead of the third package and the second lead of the fourth package may be integrally formed into a lead 62"; and a send lead 61 of the first package and a first lead 63 of the fourth package are individually formed. Of course, those skilled in the art would also appreciate that it is not compulsory that the first lead of one package and the second lead of its adjacent another package are formed integrally, which may be formed and provided separately.

Then, a plurality of chips are provided. For example, in FIG. 6, 4 chips are provided, namely, chips 64, 64', 64", and 64'''. Chips 64, 64', 64", and 64''' are fixed to upper surfaces of first leads of to-be-formed first package 60, second package 60', third package 60", and fourth package 60''' through solder using the reflow soldering method, respectively. A plurality of clips are provided. FIG. 6 shows 4 clips 67, 67', 67", and 67'''. The clips 67, 67', 67", and 67''' are clipped to the second leads, respectively, and the clips 67, 67', 67", and 67''' are fixed to corresponding chips 64, 64', 64", and 64''' through solder using the reflow soldering method. Then, all components are molded by the molding compound to form a package array.

Finally, the formed integrally presented package array is aligned and cut to obtain a plurality of individual packages. The ends of the first lead and second lead of each package are only exposed from the molding compound without outward extending therefrom. In particular, the entire lead frame array will be molded as one solid block. The cavity of the molding compound can be a single rectangular prism. These are easy to make, low cost, and very reliable when molding solid blocks of frames and chips together. When the array is fully encapsulated, the packages are diced by a simple straight cut that cuts both the molding compound of the package and the sidewall ends of the leads 53 and 52 in a single cut, thus ensuring that the side walls of the molding compound for the package are flush with the side wall ends of the leads 53 and 52.

Compared with the conventional method of forming an SMAF one by one in a separate unit module or a custom mold, based on a lead frame shape, the method according to the above embodiment of the present disclosure saves more costs, and its processing is much simpler.

In the above method, it is optional that the lower surfaces of each first lead and second lead are exposed from the package. Alternatively, before the cutting step in the above method, the lower surfaces of the first lead and second lead may be exposed through grinding or other method.

In the above method, like what is described with reference to FIG. 4, the clips are of a bent shape. Those skilled in the art may also conceive of other shapes.

In the above method, like what is described with reference to FIG. 5, the clips are of a cap shape, the cap shape is flat in two ends, but projecting outward in the middle. Those skilled in the art may also conceive of other shapes.

In an optional example, with reference to the description of the scenario in which the SMAF comprises a third lead, a third lead is provided and the chip is electrically coupled to the third lead before forming a package array using a molding compound; and after individual packages are formed through cutting, the end of the third lead is only exposed from the molding compound without outward extending from the molding compound. More optionally, the third lead is exposed from a bottom surface of the molding compound.

The above described method of modularizing an SMAF array and cutting to obtain the leadless SMAF package according to the embodiments of the present disclosure can significantly reduce costs and simplify the processing flow.

Besides the method of cutting after forming a package array to obtain a plurality of packages, another embodiment of the present disclosure provides a method for forming a surface mount assembly package, the method comprises: providing a first lead and a second lead; providing a chip; fixing the chip on the first lead; providing a clip; coupling the clip and the second lead, and fixing a lower surface of the clip on an upper surface of the chip; molding the first lead, the second lead, the chip and the clip using a molding compound, thereby forming the package, wherein ends of the first lead and the second lead are only exposed from the molding compound without outward extending from the molding compound.

Generally speaking, one embodiment of the present disclosure provides a leadless surface mount assembly package. The leadless surface mount assembly package comprises: a first lead; a second lead; a chip fixed on an upper surface of the first lead; a clip coupled to the second lead, a lower surface of the clip being fixed to an upper surface of the chip; a molding compound for molding the first lead, the second lead, the chip, and the clip, wherein ends of the first lead and the second lead are only exposed from the molding compound, without outward extending from the molding compound.

Optionally, lower surfaces of the first lead and the second lead are exposed from the package.

Optionally, the clip is of a bent shape, wherein one end of the clip is inserted into the second lead and clipped to the second lead to realize coupling, and a lower surface of the other end of the clip is fixed on an upper surface of the chip.

Optionally, the clip is of a cap shape flat at two ends and projecting outward in the middle, wherein a lower surface of one end of the clip is fixed on an upper surface of the second lead, and a lower surface of the other end of the clip is fixed on an upper surface of the chip.

Optionally, ends of the first lead and the second lead exposed from the molding compound are located at opposite sides of the package.

Optionally, the package comprises a third lead, wherein the chip is electrically coupled to the third lead, and an end of the third lead is only exposed from the molding compound without outward extending from the molding compound.

Optionally, a side of the molding compound from which the third lead is exposed is different from a side of the molding compound from which the first lead and the second lead are exposed.

Optionally, a lower surface of the third lead is exposed from the package.

According to another embodiment of the present disclosure, there is provided an electronic device comprising the above package.

According to a further embodiment of the present disclosure, there is provided a method for forming a surface mount assembly package. The method comprises: providing a plurality of first leads and a plurality of second leads; providing a plurality of chips; fixing the chips to corresponding first leads, respectively; providing a plurality of clips; coupling the clips to corresponding second leads, respectively, and fixing lower surfaces of the clips on upper surfaces of corresponding chips; molding the plurality of first leads, the plurality of second leads, the chip, and the clip using a molding compound to form a package array; and cutting the package array to form a plurality of individual packages, wherein ends of first leads and second leads of each formed package are only exposed from the molding compound without outward extending from the molding compound.

Optionally, forming a package array using a molding compound comprises: exposing lower surfaces of the first leads and the second leads from the packages.

Optionally, the clips are of a bend shape, and coupling the clips to corresponding second leads, respectively, comprises: inserting one ends of the clips into the second leads and clipped the one ends of the clips to the second clips to realize coupling, and fixing lower surfaced of the other end of the clips on upper surfaces of the chips.

Optionally, the clips are of a cap shape flat in two ends and projecting outward in the middle, and coupling the clips to the corresponding second pins, respectively, comprises: fixing lower surfaces of one ends of the clips on upper surfaces of the second leads, and fixing lower surfaces of the other ends of the clips on upper surfaces of the chips.

Optionally, ends of the first leads and the second leads exposed from the molding compound are located at opposite sides of the packages.

Optionally, the method further comprises: before forming a package array using a molding compound, providing a third lead and electrically coupling the chips to the third lead; and after forming individual packages through cutting, an end of the third lead is only exposed from the molding compound without outward extending from the molding compound.

Optionally, a side of the molding compound from which the third lead is exposed is different from a side of the molding compound from which the first lead and the second lead are exposed.

Optionally, a lower surface of the third lead is exposed from the package.

According to a still further embodiment of the present disclosure, there is provided a method for forming a surface mount assembly package, the method comprising: providing a first lead and a second lead; providing a chip; fixing the chip on the first lead; providing a clip; coupling the clip and the second lead, and fixing a lower surface of the clip on an upper surface of the chip; molding the first lead, the second lead, the chip and the clip using a molding compound, thereby forming the package, wherein ends of the first lead and the second lead are only exposed from the molding compound without outward extending from the molding compound.

Optionally, forming a package using a molding compound comprises: exposing lower surfaces of the first lead and the second lead from the package.

Optionally, the clip is of a bend shape, and coupling the clip to the second lead comprises: inserting one end of the clip into the second lead and clipping the one end of the clip to the second lead to realize coupling, and fixing a lower surface of the other end of the clip to an upper surface of the chip.

Optionally, the clip is of a cap shape flat at two ends and projecting outward in the middle, and coupling the clip to the second lead comprises: fixing a lower surface of one end of the clip on an upper surface of the second lead, and fixing a lower surface of the other end of the clip on an upper surface of the chip.

Optionally, ends of the first lead and the second lead exposed from the molding compound are located at opposite sides of the package.

Optionally, the above method further comprises: before forming the package using a molding compound, providing a third lead and electrically coupling the chip to the third lead; and after forming the package, an end of the third lead is only exposed from the molding compound without outward extending from the molding compound.

Optionally, a side of the molding compound from which the third lead is exposed is different from a side of the molding compound from which the first lead and the second lead are exposed.

Optionally, a lower surface of the third lead is exposed from the package.

Although the present disclosure has been described with reference to several preferred embodiments, it should be understood that the present disclosure is not limited to the disclosed preferred embodiments. The present disclosure intends to cover various modifications and equivalent arrangements included within the spirit and scope of the appended claims. The scope of the appended claims satisfies the broadest explanations and therefore includes all such amendments, and equivalent structures and functions.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A leadless surface mount assembly package, comprising:
    a first lead;
    a second lead;
    a third lead;
    a chip fixed on an upper surface of the first lead and electrically coupled to the third lead;
    a clip coupled to the second lead, a lower surface of the clip being fixed to an upper surface of the chip; and
    a molding compound for molding the first lead, the second lead, the chip, and the clip, the side wall ends of the first lead and the second lead being substantially flush with the side wall surfaces of the package, an end of the third lead is only exposed from the molding compound without outward extending from the molding compound and a side of the molding compound from which the third lead is exposed is different from a side of the molding compound from which the first lead and the second lead are exposed.

2. The package according to claim 1, wherein lower surfaces of the first lead and the second lead are exposed from the package.

3. The package according to claim 1, wherein the clip is of a bent shape, with one end of the clip being inserted into the second lead and connected to an interior region of the second lead to realize the coupling, and a lower surface of the other end of the clip is fixed on an upper surface of the chip.

4. The package according to claim 1, wherein the clip is of a cap shape, the cap shape being flat at two ends and projecting outward in the middle, wherein a lower surface of one end of the clip is fixed on an upper surface of the second lead, and a lower surface of the other end of the clip is fixed on an upper surface of the chip.

5. The package according to claim 1, wherein side wall ends of the first lead and the second lead exposed from the molding compound are located on opposite sides of the package.

6. The package according to claim 1, wherein a lower surface of the third lead is exposed from the package.

7. A method for forming a surface mount assembly package, comprising:
    providing an array of a plurality of first leads, a plurality of second leads, and a plurality of third leads;
    fixing a plurality of chips to corresponding first leads, respectively;
    coupling a plurality of clips to corresponding second leads, respectively;
    coupling the plurality of chips to corresponding third leads, respectively;
    fixing lower surfaces of the clips on upper surfaces of corresponding chips that are fixed to the first leads;
    molding the plurality of first leads, the plurality of second leads, the plurality of third leads, the chip, and the clip using a molding compound to form a package array; and
    cutting the package array to form a plurality of individual packages, in which ends of first leads, second leads, and third leads on the side walls of each formed package are only exposed from the molding compound without outward extending from the molding compound, the ends of the third leads being exposed from a side of the molding compound different from which the first lead and the second lead are exposed.

8. The method according to claim 7, wherein forming a package array using a molding compound further comprises:
    exposing lower surfaces of the first lead and the second lead from the package.

9. The method according to claim 7, wherein the clips are of a bend shape, and
    coupling the clips to corresponding second leads, respectively, comprises:
        inserting one ends of the clips into the second leads and clipping the one ends of the clips to the second leads to realize the coupling, and fixing lower surfaces of the other ends of the clips on upper surfaces of the chips.

10. The method according to claim 7, wherein the clips are of a cap shape that is flat in two ends and is projecting outward in the middle, and
    coupling the clips to the corresponding second pins, respectively, comprising:
        fixing lower surfaces of one ends of the clips on upper surfaces of the second leads, and fixing lower surfaces of the other ends of the clips on upper surfaces of the chips.

11. A method for forming a surface mount assembly package, the method comprising:
    providing a first lead, a second lead, and a third lead;
    providing a chip;
    fixing the chip on the first lead;
    electrically coupling the chip to the third lead;
    providing a clip;
    coupling the clip and the second lead, and fixing a lower surface of the clip on an upper surface of the chip;
    molding the first lead, the second lead, the third lead, the chip and the clip using a molding compound, thereby forming the package, wherein end walls of the first lead, the second lead, and the third lead are only exposed from the molding compound without outward extending from a sidewall of the molding compound.

12. The method according to claim 11, wherein forming a package using a molding compound further comprises:
    exposing lower surfaces of the first lead and the second lead from the package.

13. The method according to claim 11, wherein, the clip is of a cap shape flat at two ends and projecting outward in the middle, and
    coupling the clip to the second lead comprises:
        fixing a lower surface of one end of the clip on an upper surface of the second lead, and fixing a lower surface of the other end of the clip on an upper surface of the chip.

14. The method according to claim 11, wherein ends of the first lead and the second lead exposed from the molding compound are located at opposite sides of the package.

* * * * *